United States Patent [19]

Miyazaki

[11] Patent Number: 4,512,843
[45] Date of Patent: Apr. 23, 1985

[54] MANUFACTURING A CARRIER TAPE OR TAPES

[75] Inventor: Shu Miyazaki, Fussa, Japan

[73] Assignee: Sumitomo Metal Mining Company Limited, Tokyo, Japan

[21] Appl. No.: 535,862

[22] Filed: Sep. 26, 1983

[30] Foreign Application Priority Data

Sep. 30, 1982 [JP] Japan .............................. 57-171178
Sep. 30, 1982 [JP] Japan .............................. 57-171179

[51] Int. Cl.³ .......................... C23F 1/02; B44C 1/22; C03C 15/00; C03C 25/06
[52] U.S. Cl. .................... 156/644; 29/576 S; 156/645; 156/661.1; 156/634; 156/656; 357/70; 430/312; 430/313; 430/318
[58] Field of Search ............... 156/656, 645, 634, 644, 156/659.1, 661.1, 664–666, 901, 902; 174/68.5; 357/70; 430/312–314, 318, 329; 29/576 S; 361/421

[56] References Cited

U.S. PATENT DOCUMENTS 4,049,903 9/1977 Kobler .............................. 357/70 X
4,339,296 7/1982 Gursky et al. .................. 156/640 X

*Primary Examiner*—William A. Powell
*Attorney, Agent, or Firm*—Watson, Cole, Grindle & Watson

[57] ABSTRACT

A method of manufacturing a carrier tape for use in the continuous production of integrated circuits includes the formation of finger leads and sprocket holes in a metallic foil tape. The method includes the steps of stamping perforations adjacent the edges of the tape (Step B), coating both sides of the tape with a photoresist layer (6) (Step C), and then exposing the photoresist layers to light which has passed through a patterned mask (Step D). Sensitized or non-sensitized portions (7,8) of the photoresist layers are dissolved (Step E), and the uncovered portions of the metallic foil tape etched away (Step F) to leave a carrier tape which after dissolving the remaining photoresist, comprises a tape of a required width having apertures corresponding to finger lead patterns and sprocket hole patterns embodied in the original mask. By providing perforations in the margins of the starting material, the tape can be accurately located during the exposure step without having to pre-form sprocket holes. Such pre-formed sprocket holes are liable to be damaged in the exposure step, leading to inaccuracies when integrated circuit chips are brought into contact with the finger leads. The method can be applied to the manufacture of several carrier tapes formed side-by-side from a single, relatively wide metallic foil tape material.

12 Claims, 3 Drawing Figures

MANUFACTURING A CARRIER TAPE OR TAPES

BACKGROUND OF THE INVENTION

1. Field of the Invention

This invention relates to a method for the manufacture of a carrier tape or tapes to be used in feeding lead wires to semiconductor integrated circuit (IC) devices.

2. Description of the Prior Art

Connection between electrodes on IC devices and external leads is generally effected by wire bonding. In recent years, for the purpose of automating the actual deposition of IC devices on their substrates, the practice of using a carrier tape constructed as illustrated in FIG. 1 has been finding widespread acceptance.

This carrier tape is obtained by preparing a metallic foil tape 1 of copper, iron, or iron-nickel alloy, for example, having a thickness of about or under 200μ, causing sprocket holes 2 to be perforated at spaced positions spaced along each of the opposite edges of the metallic foil tape 1 and a plurality of finger leads, each consisting of an aggregate of a plurality of super fine leads 3, to be formed in the longitudinal direction along the centre of the metallic foil tape 1, and coating the entire surface of the tape 1 with gold or tin, for example, as occasion demands. In use of this carrier tape the inner leads of the fingers are positioned over the electrodes deposited on the IC devices, and collectively bonded thereto so as to fasten a succession of IC devices to the aforementioned tape. The outer ends of the leads are then cut and connected to external leads as required. During this procedure, the sprocket holes 2 are used to position the tape relative to the IC devices for the purpose of the aforementioned collective bonding and cutting steps.

Conventional continuous photo-etching techniques can be applied to the manufacture of such a carrier tape, but this calls for special precautions because the tape has an extremely small thickness compared with the usual materials for which the technique is used. In the case of a usual material, for example, sprocket holes are perforated first of all and then used in feeding the tape itself and positioning the tape for exposure to light. If this concept is applied directly to the metallic foil tape, the sprocket holes 2 are deformed and, thus, are no longer usable for accurate collective bonding of IC devices. To avoid this trouble, the required feeding of the metallic foil tape has been heretofore effected by the use of pinch rollers. With pinch rollers, however, since the photoresist layer (which has been exposed to light through an elaborate mask) is pressed between the rollers, the latent patterns may be deformed, which means that when these latent patterns are developed, the developed patterns for sprocket holes and finger leads are also deformed. This disadvantage can be overcome by employing a metallic foil tape having a width greater than the width of the finished carrier tape and feeding this metallic foil tape with the marginal edges thereof pinched by grip rollers as taught by U.S. Pat. No. 4,227,983. Where the metallic foil tape, which has been coated with photoresist, is subjected to continuous exposure to light, however, positioning of the tape by means of grip rollers and roller guides, can lead to uneven spacing and inaccurate directional alignment between the successive sets of sprocket holes and finger leads to be formed in the tape. The occurrence of such deviations can be ascribed to the accuracy of the feeding by the grip rollers and the clearance between the roller guide and the metallic foil tape. When the deviation between adjacent sets in terms of distance and direction is excessively large, although the position of the tape may be more or less corrected by the sprocket holes 2, the bonding will take place while this correction is still in process. The avoidance of this problem has in the part been achieved at the expense of speed, i.e., solely by increasing the period for positioning the tape for the purpose of bonding.

SUMMARY OF THE INVENTION

It is an object of this invention to avoid at least some of the disadvantages suffered by the conventional methods.

According to one aspect of this invention, there is provided a method of manufacturing a carrier tape having a plurality of sets of sprocket holes and finger leads formed successively therein, with the sprocket holes along each of the opposite edges of the tape and the finger leads in a middle portion of the tape between the sprocket holes, the method comprising: providing as a raw material a metallic foil tape of a width greater than the required width of the carrier tape, forming perforations spaced at fixed intervals along each of the opposite edges of the metallic foil tape, applying a photoresist to each of the opposite surfaces of the metallic foil tape over a width greater than or equal to the required width of the carrier tape, then positioning the metallic foil tape for exposure to radiation by means of the perforations, irradiating the photoresist layers to form, in the photoresist layers, patterns for the sprocket holes and finger leads, removing either the portions of photoresist which have been irradiated or the portions which have not been irradiated, subsequently etching the resulting uncovered portions of the metallic foil tape to form the required sprocket holes and finger leads, and removing the remaining portions of photoresist. This method enables the patterns for the sprocket holes and those for the finger leads to be accurately aligned in terms of direction and their sets to be separated by a fixed interval.

The photoresist may be applied to the entire width of the metallic foil tape or to a width greater than the required width of the carrier tape, the edges of the finished carrier tape being defined by longitudinal slit patterns irradiated onto the photoresist at the same time as the patterns for the sprocket holes and finger leads. The marginal portions so formed after etching can then be separated from the carrier tape as the final step of the production method.

According to another aspect, the invention includes a method for the simultaneous manufacture of a plurality of carrier tapes, each having a plurality of sets of sprocket holes and finger leads formed successively therein, with the sprocket holes along each of the opposite edges of each of the tapes and the finger leads in a middle portion of each of the tapes between the respective sprocket holes, the method comprising: providing as a raw material a metallic foil tape of a width greater than the sum of the respective required widths of the plurality of carrier tapes, forming perforations spaced at fixed intervals along each of the opposite edges of the metallic foil tape, applying photoresist to both of the opposite surfaces of the metallic foil tape over the entire width of the tape or widths greater than the widths required of the plurality of carrier tapes, then positioning the metallic foil tape for exposure to radiation by means of the perforations, irradiating the photoresist layers to form in the photoresist layers and across the width of the tape, as many sets of patterns for sprocket holes and patterns for finger leads as carrier tapes to be produced and as many longitudinal slit patterns distributed one each on the lines along which the metallic foil tape is to be severed, removing either the portions of photoresist which have been irradiated or the portions which have not been irradiated, subsequently etching the resulting uncovered portions of the metallic foil tape to form the required sprocket holes, finger leads and slits, and removing the remaining portions of photoresist.

BRIEF DESCRIPTION OF THE DRAWINGS

The invention will now be described by way of example with reference to the drawings in which.

DETAILED DESCRIPTION OF PREFERRED EMBODIMENTS

The invention permits the manufacture of a carrier tape or tapes having successive sets of sprocket holes and finger leads relatively evenly spaced and accurately aligned, and can allow a comparatively high bonding speed and with low incidence of rejectable bonding.

Figure 1:
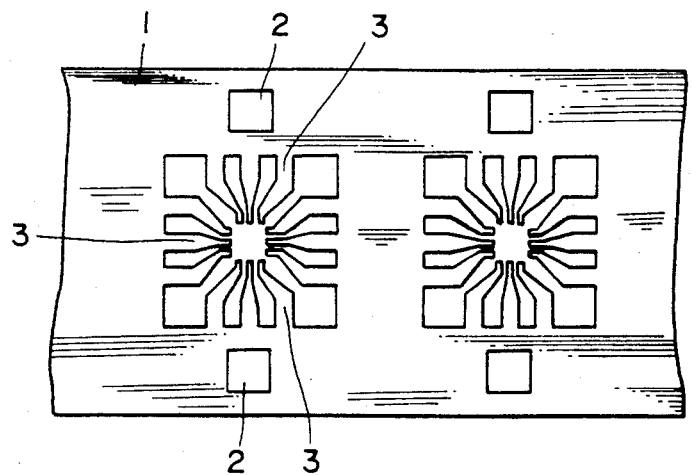
FIG. 1 is a plan view of a carrier tape.
Figure 2:
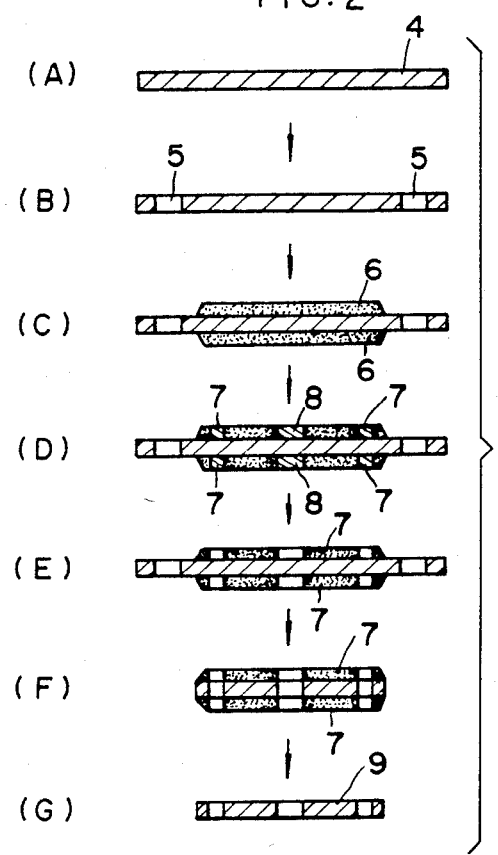
FIG. 2 is a diagram illustrating the steps of a first method of manufacturing the carrier tape of FIG. 1 in accordance with the invention.

The elements of the carrier tape shown in FIG. 1 have been described above. Referring now to FIG. 2, a first method of producing a single carrier tape has a number of steps identified as steps (A) and (C) in the Figure.

FIG. 2 is a diagram for illustrating a typical flow of steps involved in the manufacture of a carrier tape in accordance with the method of this invention. In FIG. 2 (A) to (G) represent in cross section the successive configurations of a metallic foil tape being converted into the carrier tape of FIG. 1. The metallic foil tape 4 used as the raw material has a width large enough to permit formation of two rows of perforations, one each outside along the lines which will define the lateral extent of a carrier tape to be eventually produced out of this foil tape (Step A). Firstly, regularly spaced perforations 5 are formed in this tape 4 in two rows, one each along the opposite edges of the tape by means of stamping (Step B). The feeding of the tape 4 in this case if effected as with grip rollers. When positioning pins are provided subsequently to the step using the press die for perforation, they will serve to minimize possible loss of accurate spacing of the perforations relative to the longitudinal and lateral directions of the tape.

Secondly, the tape 4 is coated on both surfaces thereof with photoresist 6 (Step C), the width of each coating corresponding to the required width of the carrier tape. The photoresist may be either a negative type or positive type. Either of the types of photoresist may be advantageously used insofar as the exposure masks to be used are adapted to suit the type of photoresist actually adopted. The opposite surfaces of the metallic foil tape thus coated with the photoresist 6 are exposed through prescribed masks to light, so as to form patterns 7 for sprocket holes and patterns 8 for finger leads, as latent images in the photoresists layers (Step D). After this exposure to light, the portions of the resist sensitized or not sensitized are dissolved out (the treatment hereinafter referred to as "development"; Step E) and an etching liquid is sprayed against both surfaces of the tape to dissolve out the uncovered portions of the underlying metallic foil to form apertures corresponding to the patterns in the original mask (step F). By this time, the opposite marginal portions of the metallic foil tape, which escaped being coated with photoresist, have also been dissolved. After this etching, the photoresist 6 still remaining on the tape is completely removed. The process results in the conversion of the raw material tape 4 into the carrier tape 9 as illustrated in FIG. 1 (Step G). This carrier tape 9 is wound up in a roll after completion of the series of steps mentioned above.

All these steps may be carried out continuously or independently. Otherwise, they may be carried out as divided into a small number of groups. In the steps mentioned above, the step for perforation and the step for exposure require the tape to be driven forward intermittently. When all the steps, including these two steps, are to be carried out continuously, such continuous operation may be obtained without any interruption by causing the tape to be well loosened before and after each of the two steps which require intermittent drive.

The method shown diagrammatically in FIG. 2 has been described with respect to production of a single carrier tape from the metallic foil tape. Simultaneous production of a plurality of carrier tapes in parallel may be accomplished by (a) preparing a metallic foil tape of a width greater than the sum of the respective widths of the plurality of carrier tapes to be produced and (b), during the step in which the photoresist is exposed to light, using photomasks which contain, across the width of the tape, as many sets of patterns for sprocket holes and patterns for finger leads as the carrier tapes to be eventually produced and so many slit patterns as to be distributed one each on the lines along which the metallic foil tape is to be severed. A plurality of sets of patterns for sprocket holes and patterns for finger leads may be formed on the tape in the longitudinal direction thereof by a single exposure of the tape to light.

Figure 3:
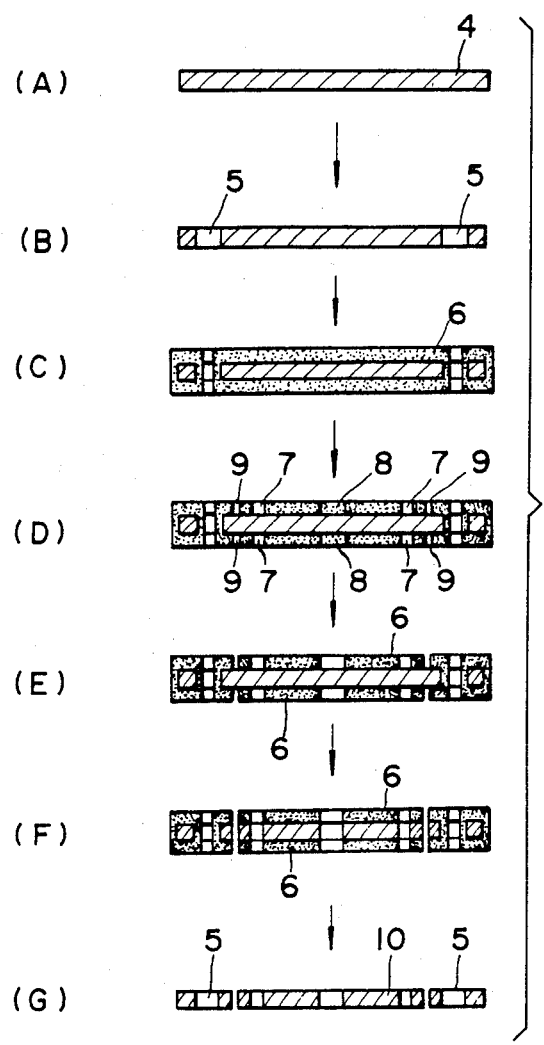
FIG. 3 is a diagram illustrating the steps of a second method of manufacturing the carrier tape of FIG. 1 in accordance with the invention.

A second method in accordance with the invention has a number of steps identified as (A) to (G) in FIG. 3.

In FIG. 3 (A) to (G), as in FIG. 2, represent in cross section successive states of a metallic foil tape being converted into the carrier tape. As before, a metallic foil tape 4 is used as the raw material and has a width large enough to permit formation of two rows of perforations, one each outside along the lines which will define the lateral extent of a carrier tape to be eventually produced out of this foil tape (Step A). Firstly, regularly spaced perforations 5 are formed in two rows one each along the opposite edges of the tape by means of stamping (Step B). Then the tape 4 is coated on both surfaces with photoresist 6 across its entire width. The photoresist may, as before, be either a negative type or positive type (Step C). The opposite surfaces of the metallic foil tape thus coated with the photoresist 6 are exposed through prescribed masks to light, so as to form in the layers of photoresist 6 patterns 7 for sprocket holes, patterns 8 for finger leads, and, in this case, slit patterns 9 on the outer sides of the patterns 7 for sprocket holes, all as latent images in the photoresist (Step D). After this exposure to light, the portions of the resists sensitized or not sensitized are developed (Step E), and etching liquid is sprayed against the two surfaces of the tape to dissolve out the exposed portions of the underlying metallic foil and form apertures corresponding to the patterns in the mask (Step F). After this etching, the photoresist 6 still remaining on the plate is completely removed and the narrow outermost strips of tape containing the rows of perforations 5 along the opposite ends of the tape are ripped off along the slit patterns 9 by being wound up in two separate rolls. The central portion 10 of the tape which is left behind constitutes a carrier tape constructed as illustrated in FIG. 1 (Step G).

Again, these steps may be carried out continuously or independently as described above, slack being introduced into the tape where necessary.

In the above-described process, steps (B) and (C) in FIG. 3 may be reversed. In the reversed sequence, therefore, the metallic foil tape 4 is coated on both surfaces thereof with photoresist 6 and then the two rows of perforations 5 are formed one each along the opposite edges of the tape by means of stamping. This reversal of the sequence of these two steps gives no hindrance of any sort to the positioning of the tape for exposure to light. The inner walls of the perforations 5 are not coated with the photoresist 6 in this case, which means they are corroded and enlarged in area during the etching step (F). However, this is not of importance since they have already served their purpose. Also, in this respect, the aforementioned reversal of the sequence has no adverse effect. It will be readily understood that the application of the photoresist during step (C) need not be over the entire width of the foil tape but may be limited to a width slightly greater than the width which the finished carrier tape is required to possess.

The method illustrated in FIG. 3 may also be applied to the simultaneous production of a plurality of carrier tapes by preparing a metallic foil tape of a width greater than the sum of the respective widths of the plurality of carrier tapes to be produced.

The masks used for exposing the photoresist to light contain, across the width of the tape, as many sets of patterns for sprocket holes and patterns for finger leads as the carrier tapes to be eventually produced and as many slit patterns as are needed to be distributed one each on the lines along which the metallic foil tape is to be severed and one each on outer sides of the patterns for sprocket holes.

I claim:

1. A method of manufacturing a carrier tape having a plurality of sets of sprocket holes and finger leads formed successively therein, with the sprocket holes along each of the opposite edges of the tape and the finger leads in a middle portion of the tape between the sprocket holes, the method comprising:

providing as a raw material a metallic foil tape of a width greater than the required width of the carrier tape, forming perforations spaced at fixed intervals along each of the opposite edges of the metallic foil tape, applying photoresist to both of the opposite surfaces of the metallic foil tape over a width greater than or equal to the required width of the carrier tape, then positioning the metallic foil tape for exposure to radiation by means of the perforations, irradiating the photoresist layers to form, in the photoresist layers, patterns for the sprocket holes and finger leads, removing either the portions of photoresist which have been irradiated or the portions which have not been irradiated, subsequently etching the resulting uncovered portions of the metallic foil tape to form the required sprocket holes and finger leads, and removing the remaining portions of photoresist.

2. A method according to claim 1, wherein the photoresist is applied to the metallic foil tape over a width equal to the required width of the carrier tape, whereby etching the tape after irradiation of the photoresist also forms the edges of the carrier tape.

3. A method according to claim 1, wherein the photoresist is applied to the metallic foil tape over a width greater than the required width of the carrier tape, the edges of the finished carrier tape being defined by the patterns with which the photoresist is irradiated.

4. A method according to claim 1, wherein the photoresist is applied to the entire width of the metallic foil tape on to a width greater than the required width of the carrier tape, and wherein the patterns with which the photoresist is irradiated include longitudinal slit patterns located outside respective sprocket hole patterns, so that marginal portions of the metallic foil tape remaining after etching can be separated from the carrier tape.

5. A method for the simultaneous manufacture of a plurality of carrier tapes each having a plurality of sets of sprocket holes and finger leads formed successively therein, with the sprocket holes along each of the opposite edges of each of the tapes and the finger leads in a middle portion of each of the tapes between the respective sprocket holes, the method comprising:

providing as a raw material a metallic foil tape of a width greater than the sum of the respective required widths of the plurality of carrier tapes, forming perforations spaced at fixed intervals along each of the opposite edges of the metallic foil tape, applying photoresist to both of the opposite surfaces of the metallic foil tape over the entire width of the tape or widths greater than the widths required of said plurality of carrier tapes, then positioning the metallic foil tape for exposure to radiation by means of the perforations, irradiating the photoresist layers to form in the photoresist layers and across the width of the tape, as many sets of patterns for sprocket holes and patterns for finger leads as carrier tapes to be produced and as many longitudinal slit patterns distributed one each on the lines along which the metallic foil tape is to be severed, removing either the portions of photoresist which have been irradiated or the portions which have not been irradiated, subsequently etching the resulting uncovered portions of the metallic foil tape to form the required sprocket holes, finger leads and slits, and removing the remaining portions of photoresist.

6. A method according to claim 5, wherein the slit patterns are distributed one each of the lines along which the metallic foil tape is to be severed and one each on outer sides of said patterns for sprocket holes, and further including the step of separating opposite marginal portions of the metallic tape to obtain a plurality of carrier tapes separated from one another.

7. A method according to claim 5, wherein the perforations are formed by means of a stamping.

8. A method according to claim 5, wherein the irradiation of the photoresist layers on the opposite surfaces of the metallic foil tape is effected so that the plurality of sets of patterns for sprocket holes and patterns for finger leads are formed simultaneously in the photoresist layers in the longitudinal direction of the tape by a single exposure to radiation.

9. A method according to claim 5, wherein the radiation is light radiation.

10. A method according to claim 1, wherein the perforations are formed by means of a stamping.

11. A method according to claim 1, wherein the irradiation of the photoresist layers on the opposite surfaces of the metallic foil tape is effected so that the plurality of sets of patterns for sprocket holes and patterns for finger leads are formed simultaneously in the photoresist layers in the longitudinal direction of the tape by a single exposure to radiation.

12. A method according to claim 1, wherein the radiation is light radiation.

* * * * *